(12) United States Patent
Kurihara

(10) Patent No.: US 7,532,068 B2
(45) Date of Patent: May 12, 2009

(54) DIFFERENTIAL AMPLIFIER CIRCUIT

(75) Inventor: Shinji Kurihara, Ota (JP)

(73) Assignees: Sanyo Electric Co., Ltd., Osaka (JP); Sanyo Semiconductor Manufacturing Co., Ltd., Niigata (JP)

( * ) Notice: Subject to any disclaimer, the term of this patent is extended or adjusted under 35 U.S.C. 154(b) by 0 days.

(21) Appl. No.: 11/946,760

(22) Filed: Nov. 28, 2007

(65) Prior Publication Data

US 2008/0129383 A1    Jun. 5, 2008

(30) Foreign Application Priority Data

Nov. 30, 2006    (JP) .............................. 2006-324016

(51) Int. Cl.
$H03F$ $3/45$ (2006.01)
(52) U.S. Cl. ...................................................... 330/253
(58) Field of Classification Search ................. 330/253, 330/261
See application file for complete search history.

(56) References Cited

U.S. PATENT DOCUMENTS 7,180,371 B2 * 2/2007 Daniel ........................ 330/261

FOREIGN PATENT DOCUMENTS

JP    2005-223627    8/2005

* cited by examiner

Primary Examiner—Robert Pascal
Assistant Examiner—Khiem D Nguyen
(74) Attorney, Agent, or Firm—SoCal IP Law Group LLP; Steven C. Sereboff; John E. Gunther

(57) ABSTRACT

A differential amplifier circuit includes a first transistor in which an electrode on one side is connected to a first constant current source, an electrode on the other side is connected to a second constant current source, and the control electrode is applied with a first input voltage; a second transistor in which an electrode on one side is connected to the first constant current source, an electrode on the other side is connected to a third constant current source, and the control electrode is applied with a second input voltage; and a third transistor in which an electrode on one side is connected to the electrode on the other side of the first or second transistor, the third transistor outputting to an electrode on the other side thereof a current corresponding to a difference between the first and second input voltages.

5 Claims, 7 Drawing Sheets

DIFFERENTIAL AMPLIFIER CIRCUIT

CROSS-REFERENCE TO RELATED APPLICATION

This application claims the benefit of priority to Japanese Patent Application No. 2006-324016, filed Nov. 30, 2006, of which full contents are incorporated herein by reference.

BACKGROUND OF THE INVENTION

1. Field of the Invention

The present invention relates to a differential amplifier circuit.

2. Description of the Related Art

As differential amplifier circuits which accurately amplify and have a wide dynamic range, a folded-cascode differential amplifier circuit is generally used. FIG. 6 is a diagram showing a configuration example of a general folded-cascode differential amplifier circuit. A folded-cascode differential amplifier circuit 100 is configured to include a pair of differential transistors 101, and cascode transistors 102 connected to the differential transistors 101 in a folded cascode manner.

The differential transistors 101 are configured by N-channel MOSFETs (M1, M2), in which sources of the N-channel MOSFETs (M1, M2) are connected to a constant current source 103, a drain of the N-channel MOSFET (M1) is connected to a constant current source 104, and a drain of the N-channel MOSFET (M2) is connected to a constant current source 105. The differential transistors 101 perform a differential operation corresponding to an input voltage $V_{IN}{}^+$ applied to a gate of the N-channel MOSFET (M1) and an input voltage $V_{IN}{}^-$ applied to a gate of the N-channel MOSFET (M2).

The cascode transistors 102 are configured by P-channel MOSFETs (M3, M4), in which a source of the P-channel MOSFET (M3) is connected to the drain of the N-channel MOSFET (M1), and a source of the P-channel MOSFET (M4) is connected to the drain of the N-channel MOSFET (M2). Gates of the P-channel MOSFETs (M3, M4) are applied with a bias voltage $V_{BIAS}$ lower than a power supply voltage $V_{DD}$ by a certain voltage, and a current corresponding to the differential operation of the differential transistors 101 is outputted from drains of the P-channel MOSFETs (M3, M4).

Herein, $I_E$ denotes a value of a current of the constant current source 103; I denotes those of the constant current sources 104 and 105; $I_{M1}$ denotes that which passes in the N-channel MOSFET (M1); $I_{M2}$ denotes that which passes in the N-channel MOSFET (M2); $I_{M3}$ denotes that which passes in the P-channel MOSFET (M3), and $I_{M4}$ denotes that which passes in the P-channel MOSFET (M4). When the input voltages $V_{IN}{}^+$ and $V_{IN}{}^-$ are equal, a relationship of $I_{M1}=I_{M2}=I_E/2$ is established. Therefore, a relationship of $I_{M3}=I_{M4}=I-I_E/2$ is established. When there is a difference between the input voltages $V_{IN}{}^+$ and $V_{IN}{}^-$, relationships of $I_{M1}=I_E/2+i$ and $I_{M2}=I_E/2-i$ are established, where i denotes an amount of current change of the differential transistors 101 corresponding to the difference. Therefore, relationships of $I_{M3}=I-I_E/2-i$ and $I_{M4}=I-I_E/2+i$ are established. Thus, from the drains (output electrodes) of the cascode transistors 102, currents obtained by amplifying the difference between the input voltages $V_{IN}{}^+$ and $V_{IN}{}^-$ are outputted.

Incidentally, in the differential amplifier circuit 100, a source voltage $V_S$ of the N-channel MOSFETs (M1, M2) changes corresponding to a voltage level of the input voltages $V_{IN}{}^+$ and $V_{IN}{}^-$ applied to the gates of the N-channel MOSFETs (M1, M2), that is, a voltage level of a common mode voltage $V_{CM}$ in the input voltages $V_{IN}{}^+$ and $V_{IN}{}^-$. On the other hand, drain voltages $V_D$ of the N-channel MOSFETs (M1, M2) are a constant voltage determined by the bias voltage $V_{BIAS}$ applied to the gates of the P-channel MOSFETs (M3, M4). That is, drain-to-source voltages $V_{DS}$ of the N-channel MOSFETs (M1, M2) changes corresponding to the voltage level of the common mode voltage $V_{CM}$.

To increase frequency response of the differential amplifier circuit 100, it is effective to shorten channel lengths of the N-channel MOSFETs (M1, M2). However, when the channel lengths of the N-channel MOSFETs (M1, M2) are shortened, it becomes susceptible to influence of a channel length modulation. FIG. 7 is a graph showing one example of a relationship between the drain-to-source voltage $V_{DS}$ and a drain current ID. As shown in FIG. 7, due to the influence of the channel length modulation, the drain current ID gradually increases along with an increase of the drain-to-source voltage $V_{DS}$ even in a saturated region. Thus, when the drain-to-source voltage $V_{DS}$ changes, the drain current ID also changes. When the drain-to-source voltage $V_{DS}$ further increases, a punch through phenomenon in which a current passes irrespective of a gate voltage occurs.

Therefore, in the differential amplifier circuit 100, when the drain-to-source voltages $V_{DS}$ of the N-channel MOSFETs (M1, M2) change corresponding to the voltage level of the common mode voltage $V_{CM}$, the values of currents $I_{M1}$ and $I_{M2}$ which pass through the N-channel MOSFETs (M1, M2) change, and those of currents $I_{M3}$ and $I_{M4}$ outputted from the P-channel MOSFETs (M3, M4) also change. That is, output currents $I_{M3}$ and $I_{M4}$ change corresponding to the voltage level of the input voltage (common mode voltage), and as a result, accuracy of the differential amplification decreases.

The present invention has been achieved in view of the above-described problem, and an object thereof is to provide a differential amplifier circuit capable of stably performing a differential amplification irrespective of an input voltage level.

SUMMARY OF THE INVENTION

A differential amplifier circuit according to an aspect of the present invention, comprises: first to third constant current sources; a first transistor in which an electrode on one side configured to generate a threshold voltage in conjunction with a control electrode is connected to the first constant current source, an electrode on the other side is connected to the second constant current source, and the control electrode is configured to be applied with a first input voltage; a second transistor in which an electrode on one side configured to generate a threshold voltage in conjunction with a control electrode is connected to the first constant current source, an electrode on the other side is connected to the third constant current source, and the control electrode is configured to be applied with a second input voltage; and a third transistor in which an electrode on one side configured to generate a threshold voltage in conjunction with a control electrode is connected to the electrode on the other side of the first or second transistor, the third transistor being configured to output to an electrode on the other side thereof a current corresponding to a difference between the first and second input voltages, the control electrode of the third transistor being configured to be applied with a voltage corresponding to that of the electrodes on the one side of the first and second transistors.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

==Circuit Configuration==

Figure 1:
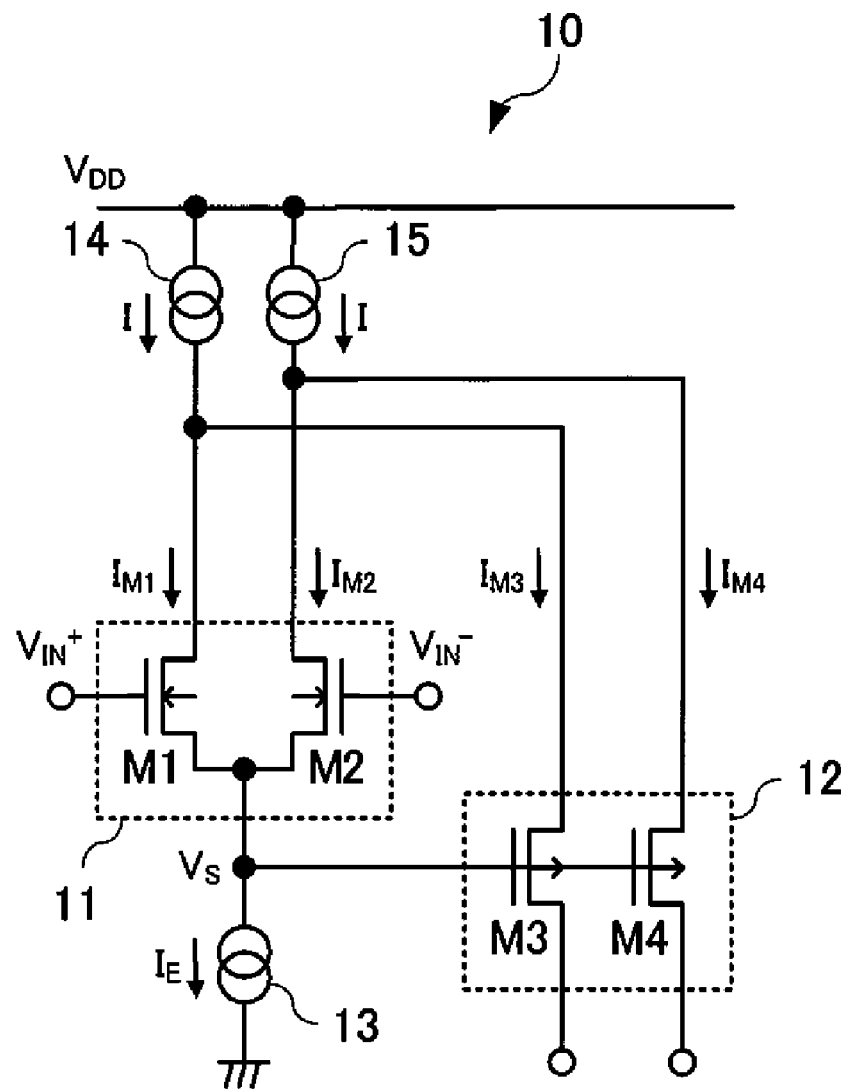
FIG. 1 is a diagram showing a configuration of a folded-cascode differential amplifier circuit, which is one embodiment of the present invention.

FIG. 1 is a diagram showing a configuration of a folded-cascode differential amplifier circuit, which is one embodiment of the present invention. A differential amplifier circuit 10 is configured to include a pair of differential transistors 11, cascode transistors 12 (folded-cascode transistors), and constant current sources 13 to 15.

The differential transistors 11 are configured by an N-channel MOSFET (M1: first transistor) and an N-channel MOSFET (M2: second transistor), in which sources (electrodes, on one side, for generating a threshold voltage in conjunction with control electrodes) of the N-channel MOSFETs (M1, M2) are connected to the constant current source 13, a drain (electrode on the other side) of the N-channel MOSFET (M1) is connected to the constant current source 14, and a drain (electrode on the other side) of the N-channel MOSFET (M2) is connected to the constant current source 15. A gate (control electrode) of the N-channel MOSFET (M1) is applied with an input voltage $V_{IN}^+$ (first input voltage), and a gate (control electrode) of the N-channel MOSFET (M2) is applied with an input voltage $V_{IN}^-$ (second input voltage). The differential transistors 11 perform a differential operation corresponding to the input voltages $V_{IN}^+$ and $V_{IN}^-$.

The cascode transistors 12 (third transistors) are configured by P-channel MOSFETs (M3, M4), in which a source (electrode, on one side, for generating a threshold voltage in conjunction with a control electrode) of the P-channel MOSFET (M3) is connected to the drain of the N-channel MOSFET (M1), and a source (electrode, on one side, for generating a threshold voltage in conjunction with a control electrode) of the P-channel MOSFET (M4) is connected to the drain of the N-channel MOSFET (M2). That is, the cascode transistors 12 are connected to the differential transistor 11 in a folded cascode manner. Gates (control electrodes) of the P-channel MOSFETs (M3, M4) are connected to the sources of the N-channel MOSFETs (M1, M2). A current corresponding to the differential operation of the differential transistors 11 is outputted to the drains (electrodes on the other side) of the P-channel MOSFETs (M3, M4).

In the constant current source 13 (first current source), one end is connected to the sources of the N-channel MOSFETs (M1, M2) and the other end is grounded. In the constant current source 14 (second current source), one end is applied with a power supply voltage $V_{DD}$ and the other end is connected to the drain of the N-channel MOSFET (M1) and the source of the P-channel MOSFET (M3). In the constant current source 15 (third current source), one end is applied with the power supply voltage $V_{DD}$ and the other end is connected to the drain of the N-channel MOSFET (M2) and the source of the P-channel MOSFET (M4).

==Description of Operation==

A description is given of an operation of the differential amplifier circuit 10. Herein, $I_E$ denotes a value of a current of the constant current source 13; I denotes those of the constant current sources 14 and 15; $I_{M1}$ denotes that which passes in the N-channel MOSFET (M1); $I_{M2}$ denotes that which passes in the N-channel MOSFET (M2); $I_{M3}$ denotes that which passes in the P-channel MOSFET (M3), and $I_{M4}$ denotes that which passes in the P-channel MOSFET (M4).

When the input voltages $V_{IN}^+$ and $V_{IN}^-$ are equal, a relationship of $I_{M1}=I_{M2}=I_E/2$ is established. Therefore, $I_{M3}=I_{M4}=I-I_E/2$. When a difference between the input voltages $V_{IN}^+$ and the $V_{IN}^-$ occurs, relationships of $I_{M1}=I_E/2+i$ and $I_{M2}=I_E/2-i$ are established, where i denotes an amount of current change of the differential transistors 11 corresponding to the difference. Therefore, relationships of $I_{M3}=I-I_E/2-i$ and $I_{M4}=I-I_E/2+i$ are established. Thus, the result is that from the drains of the cascode transistors 12, currents $I_{M3}$ and $I_{M4}$ obtained by amplifying the difference between the input voltages $V_{IN}^+$ and $V_{IN}^-$ are outputted.

Herein, in the differential amplifier circuit 10, a source voltage $V_S$ of the N-channel MOSFETs (M1, M2) changes corresponding to voltage levels of the input voltages $V_{IN}^+$ and $V_{IN}^-$ applied to the gates of the N-channel MOSFETs (M1, M2), that is, voltage levels of common mode voltage $V_{CM}$ in the input voltages $V_{IN}^+$ and $V_{IN}^-$. The gates of the P-channel MOSFETs (M3, M4) are applied with the source voltage $V_S$ of the N-channel MOSFETs (M1, M2), and thus, drain voltages $V_D$ of the N-channel MOSFETs (M1, M2) change along with a change of the source voltage $V_S$. That is, when the voltage level of the common mode voltage $V_{CM}$ changes, a change amount of the source voltage $V_S$ of the N-channel MOSFETs (M1, M2) and that of the drain voltages $V_D$ thereof are the same. As a result, drain-to-source voltages $V_{DS}$ of the N-channel MOSFETs (M1, M2) do not change.

Thus, in the differential amplifier circuit 10, even when the voltage level of the input voltage (common mode voltage) changes, the drain-to-source voltages $V_{DS}$ of the N-channel MOSFETs (M1, M2) are constant. Therefore, the output currents $I_{M3}$ and $I_{M4}$ do not change, thereby enabling a stable differential amplification. Further, since the drain-to-source voltages $V_{DS}$ of the N-channel MOSFETs (M1, M2) are constant and the differential amplifier circuit 10 is not susceptible to influence of the channel length modulation, it becomes possible to shorten the channel length, thereby increasing the frequency response. In the differential amplifier circuit 10, even when the channel length is shortened, the drain-to-source voltages $V_{DS}$ are constant. Thus, it becomes possible to prevent an occurrence of a punch through phenomenon in the N-channel MOSFETs (M1, M2).

APPLICATION EXAMPLE

Figure 2:
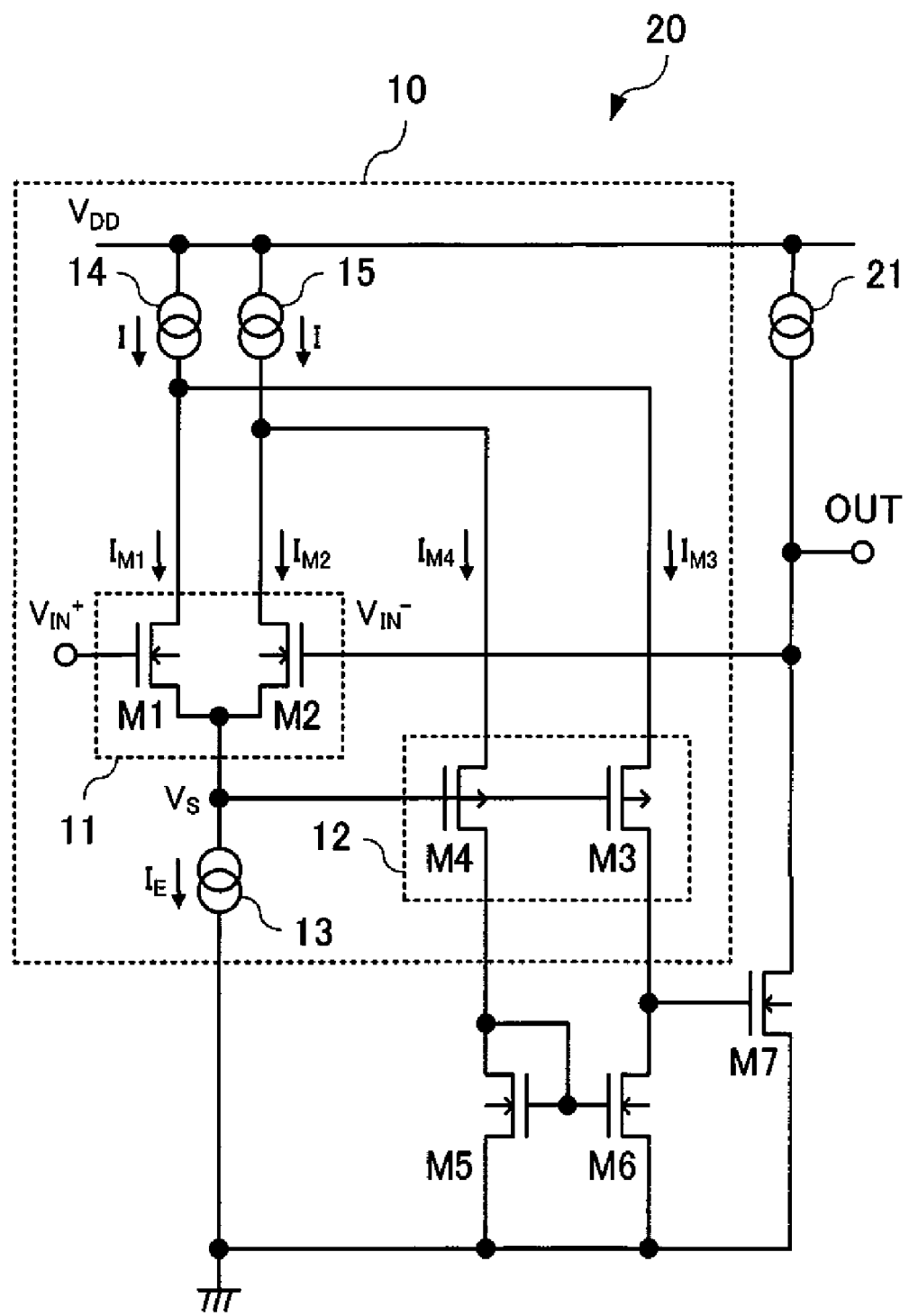
FIG. 2 is a diagram showing a configuration example of an operational amplifier to which the differential amplifier circuit according to the embodiment is applied.

Next, a description is given of an application example of the differential amplifier circuit of the embodiment. FIG. 2 is a diagram showing a configuration example of an operational amplifier to which the differential amplifier circuit according to the embodiment is applied. An operational amplifier 20 is configured to include, besides the differential amplifier circuit 10, N-channel MOSFETs (M5 to M7) and a constant current source 21.

In the N-channel MOSFET (M5), a drain is connected to the drain of the P-channel MOSFET (M4), and a source is grounded. In the N-channel MOSFET (M6), a drain is connected to the drain of the P-channel MOSFET (M3), and a source is grounded. The drain of the N-channel MOSFET (M5) and a gate thereof are connected, and gates of the N-channel MOSFETs (M5, M6) are connected to each other. That is, the N-channel MOSFETs (M5, M6) configure a current mirror circuit. It is noted that in the embodiment, the N-channel MOSFETs (M5, M6) are the same in size.

In the constant current source 21, one end is applied with the power supply voltage $V_{DD}$ and the other end is connected to a drain of the N-channel MOSFET (M7). In the N-channel MOSFET (M7), a source is grounded, and a gate is connected to the drain of the P-channel MOSFET (M3).

In the operational amplifier 20, the gate of the N-channel MOSFET (M1) is a positive (+) input terminal; the gate of the N-channel MOSFET (M2) is a negative (−) input terminal; a connection point of the current source 21 and the drain of the N-channel MOSFET (M7) is an output terminal OUT; and the output terminal OUT is connected to the (−) input terminal is connected, whereby a voltage follower is configured.

When the input voltage $V_{IN}^+$ applied to the gate of the N-channel MOSFET (M1) is higher than the input voltage $V_{IN}^-$ applied to the gate of the N-channel MOSFET (M2), $I_{M1}$ becomes larger than $I_{M2}$, and $I_{M4}$ becomes larger than $I_{M3}$. Herein, a relationship of $I_{M5}=I_{M4}$ is established, where $I_{M5}$ denotes a value of a current which passes in the N-channel MOSFET (M5). The current mirror circuit configured by the N-channel MOSFETs (M5, M6) operates such that IM6 is rendered equal to $I_{M5}$, where IM6 denotes a value of a current which passes in the N-channel MOSFET (M6), and thus, a current which passes in the N-channel MOSFET (M7) decreases. Thereby, a current which flows from the constant current source 21 into the output terminal OUT increases, and as a result, the output voltage $V_{OUT}$ of the output terminal OUT rises.

When the output voltage $V_{OUT}$ (input voltage $V_{IN}^-$) rises, it becomes higher than the input voltage $V_{IN}^+$. As a result, $I_{M1}$ becomes smaller than $I_{M2}$, and $I_{M4}$ becomes smaller than $I_{M3}$ The relationship of $I_{M5}=I_{M4}$ is established and the current mirror circuit configured by the N-channel MOSFETs (M5, M6) operates such that IM6 is rendered equal to $I_{M5}$, and thus, the current which passes in the N-channel MOSFET (M7) increases. Thereby, the current which flows from the constant current source 21 into the output terminal OUT decreases, and as a result, the output voltage $V_{OUT}$ of the output terminal OUT drops.

Thus, the operational amplifier 20 operates such that the output voltage $V_{OUT}$ is rendered equal to the input voltage $V_{IN}^+$. As described above, in the differential amplifier circuit 10, even when the voltage level of the input voltages (common mode voltage) applied to the gates of the N-channel MOSFETs (M1, M2) changes, the drain-to-source voltages $V_{DS}$ of the N-channel MOSFETs (M1, M2) are constant. Therefore, the output currents $I_{M3}$ and $I_{M4}$ do not change, thereby enabling a stable differential amplification. Therefore, the operation of the operational amplifier 20 using the differential amplifier circuit 10 also becomes stable irrespective of the input voltage level.

Figure 3:
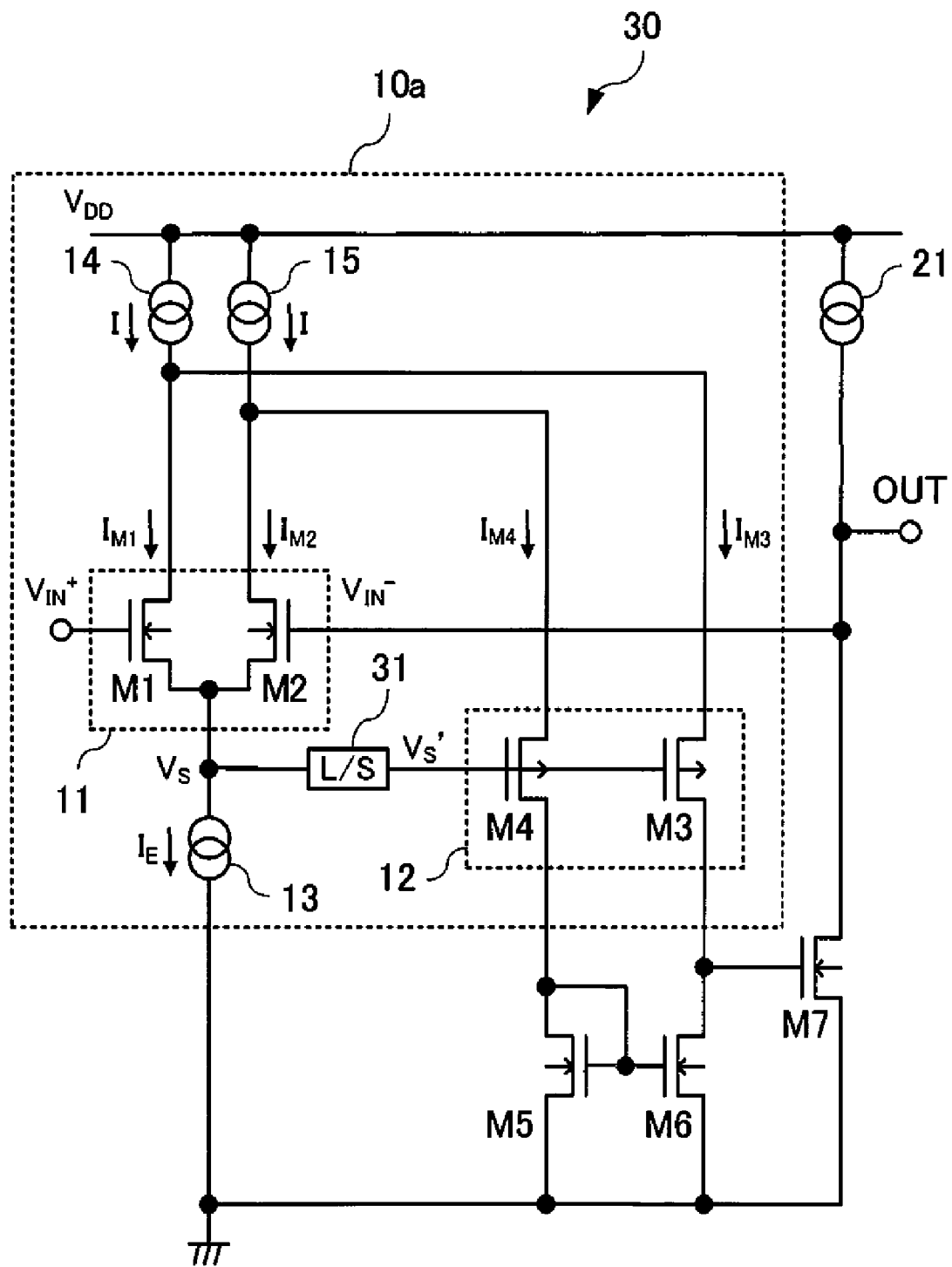
FIG. 3 is a diagram showing a configuration example in which a level shift circuit is added to the differential amplifier circuit according to the embodiment.

FIG. 3 is a diagram showing a configuration example in which a level shift circuit is added to the differential amplifier circuit according to the embodiment. The operational amplifier 30 is provided with a differential amplifier circuit 10a instead of the differential amplifier circuit 10 in the operational amplifier 20. The differential amplifier circuit 10a is provided with a level shift circuit 31, which is an addition to the configuration of the differential amplifier circuit 10.

The level shift circuit 31 generates voltage $V_S'$ obtained by changing the voltage $V_S$ of the sources of the N-channel MOSFETs (M1, M2) by a predetermined level. The gates of the N-channel MOSFETs (M3, M4), which is the cascode transistor, are applied with the voltage $V_S'$ generated by the level shift circuit 31.

Herein, in the differential amplifier circuit 10a, the source voltage $V_S$ of the N-channel MOSFETs (M1, M2) changes corresponding to the voltage levels of the input voltages $V_{IN}^+$ and $V_{IN}^-$ applied to the gates of the N-channel MOSFETs (M1, M2), that is, the voltage level of common mode voltage $V_{CM}$ in the input voltages $V_{IN}^+$ and $V_{IN}^-$ The gates of the P-channel MOSFETs (M3, M4) are applied with the voltage $V_S$ obtained by shifting the source voltage $V_S$ of the N-channel MOSFETs (M1, M2) by a predetermined level, and thus, the drain voltages $V_D$ of the N-channel MOSFETs (M1, M2) change along with a change of the source voltage $V_S$. That is, when the voltage level of the common mode voltage $V_{CM}$ changes, a change amount of the source voltage $V_S$ of the N-channel MOSFETs (M1, M2) and that of the drain voltages $V_D$ thereof are the same. As a result, the drain-to-source voltages $V_{DS}$ of the N-channel MOSFETs (M1, M2) do not change. Further, when a shift amount of the voltage in the level shift circuit 31 is adjusted, the drain-to-source voltages $V_{DS}$ of the N-channel MOSFETs (M1, M2) can be changed to a desired voltage. That is, in a characteristic provided between the drain-to-source voltages $V_{DS}$ and the drain currents ID in the N-channel MOSFETs (M1, M2), the drain-to-source voltages $V_{DS}$ can be set to a region where the N-channel MOSFETs (M1, M2) can be stably operated. This enables a stable differential amplification in the differential amplifier circuit 10a irrespective of the input voltage level.

Figure 4:
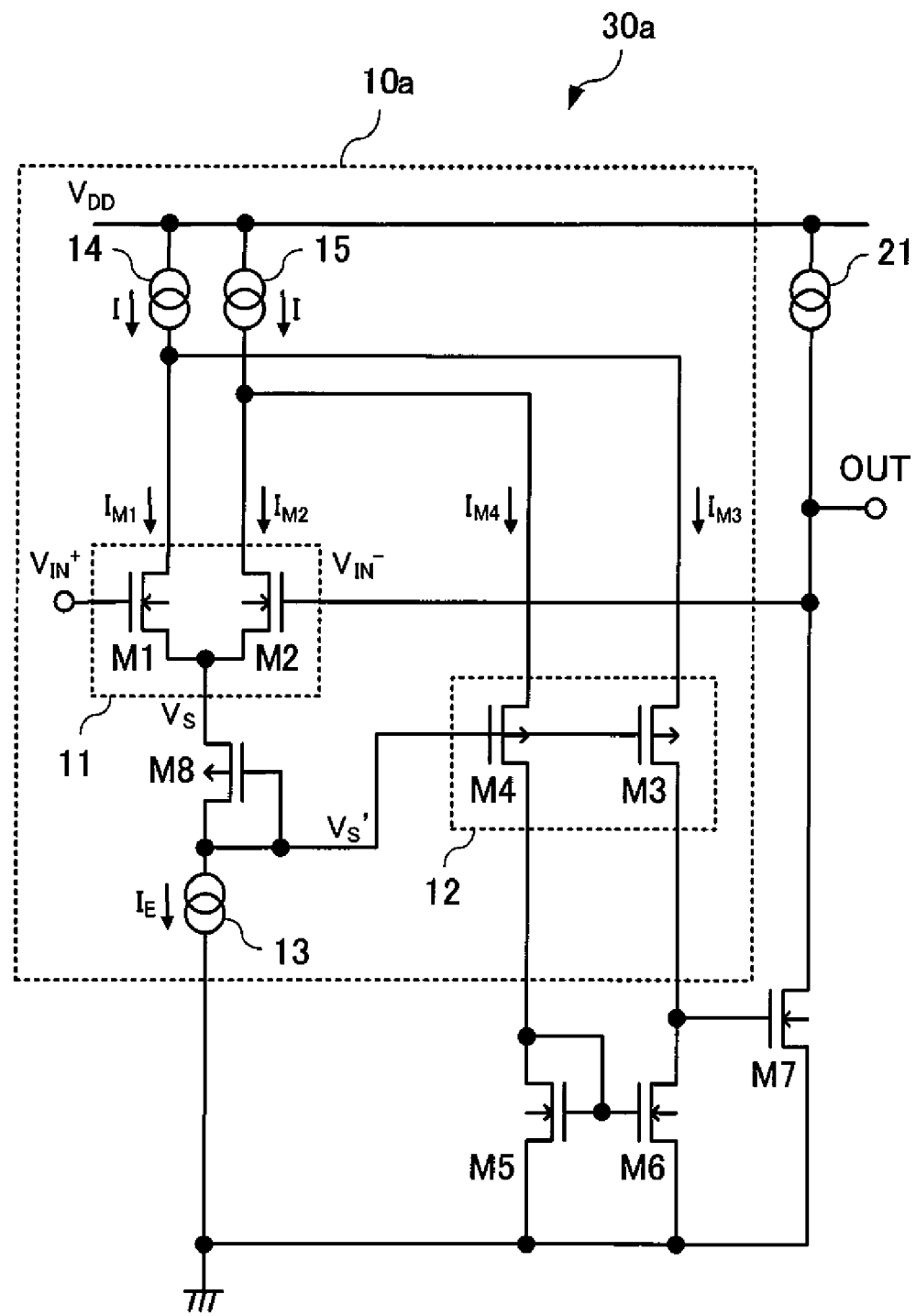
FIG. 4 is a diagram showing one example of a configuration of an operational amplifier in which the level shift circuit is embodied.

FIG. 4 is a diagram showing one example of a configuration of an operational amplifier in which the level shift circuit is embodied. In an operational amplifier 30a, the level shift circuit 31 of the operational amplifier 30 is realized by a P-channel MOSFET (M8: fourth transistor).

In the P-channel MOSFET (M8), a source (electrode, on one side, for generating a threshold voltage in conjunction with a control electrode) is connected to the sources of the N-channel MOSFETs (M1, M2), a drain (electrode on the other side) is connected to a power supply side of the constant current source 13, and a gate is connected to the drain. The gates of the P-channel MOSFETs (M3, M4), which are the cascode transistors, are connected to the drain of the P-channel MOSFET (M8). Therefore, the result is that the gates of the P-channel MOSFETs (M3, M4) are applied with voltage lower than the source voltage $V_S$ of the N-channel MOSFETs (M1, M2) by a gate-to-source voltage (predetermined level) of the P-channel MOSFET (M8). That is, in the operational amplifier 30a, it is possible to render the drain-to-source voltages $V_{DS}$ of the N-channel MOSFETs (M1, M2) lower as compared to a case of the operational amplifier 20. When the drain-to-source voltages $V_{DS}$ are lowered corresponding to a characteristic of the drain-to-source voltages $V_{DS}$ and the drain currents ID in the N-channel MOSFETs (M1, M2), the N-channel MOSFETs (M1, M2) can be stably operated. This enables a stable differential amplification irrespective of the input voltage level.

Figure 5:
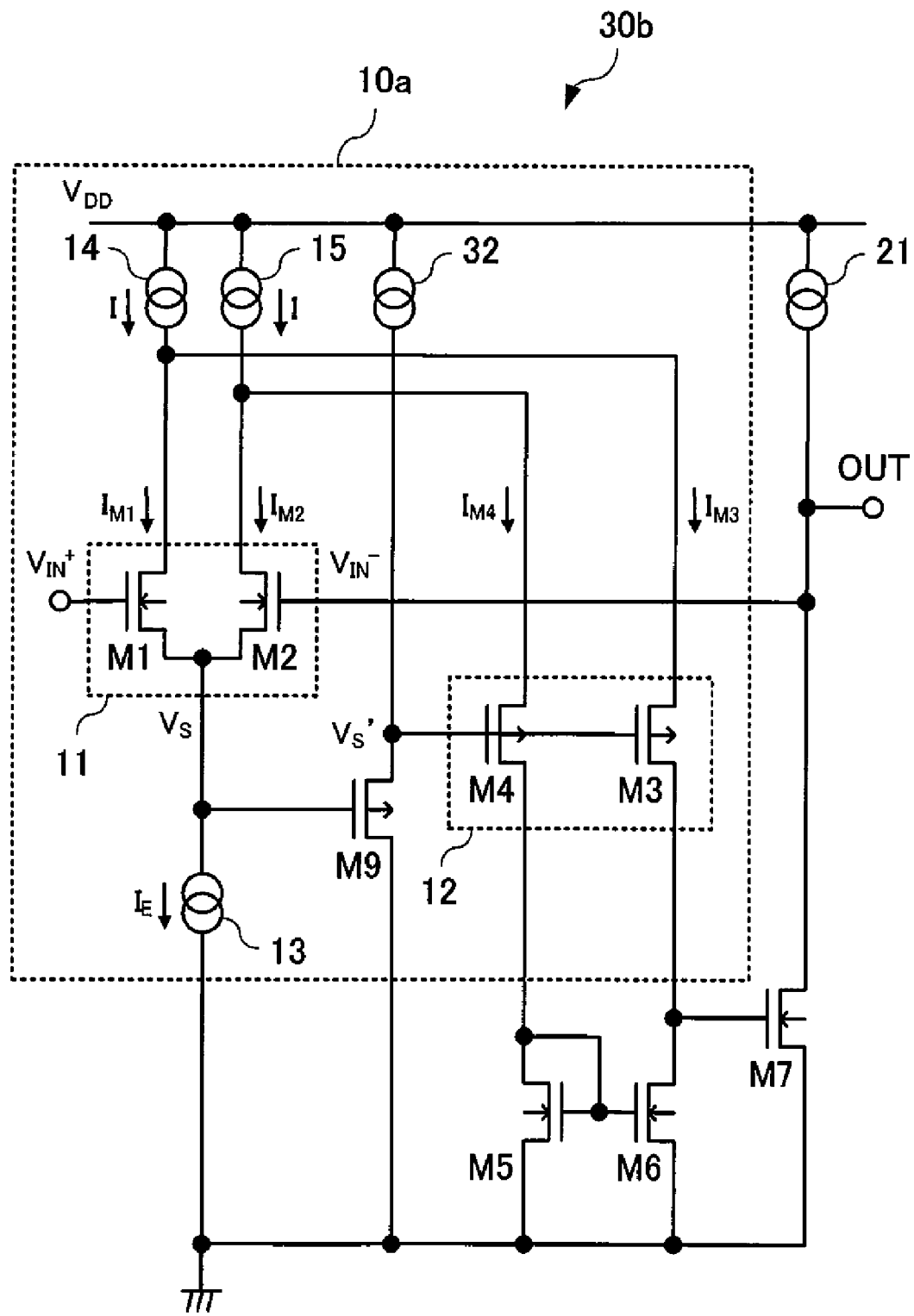
FIG. 5 is a diagram showing another example of a configuration of an operational amplifier in which the level shift circuit is embodied.
Figure 6:
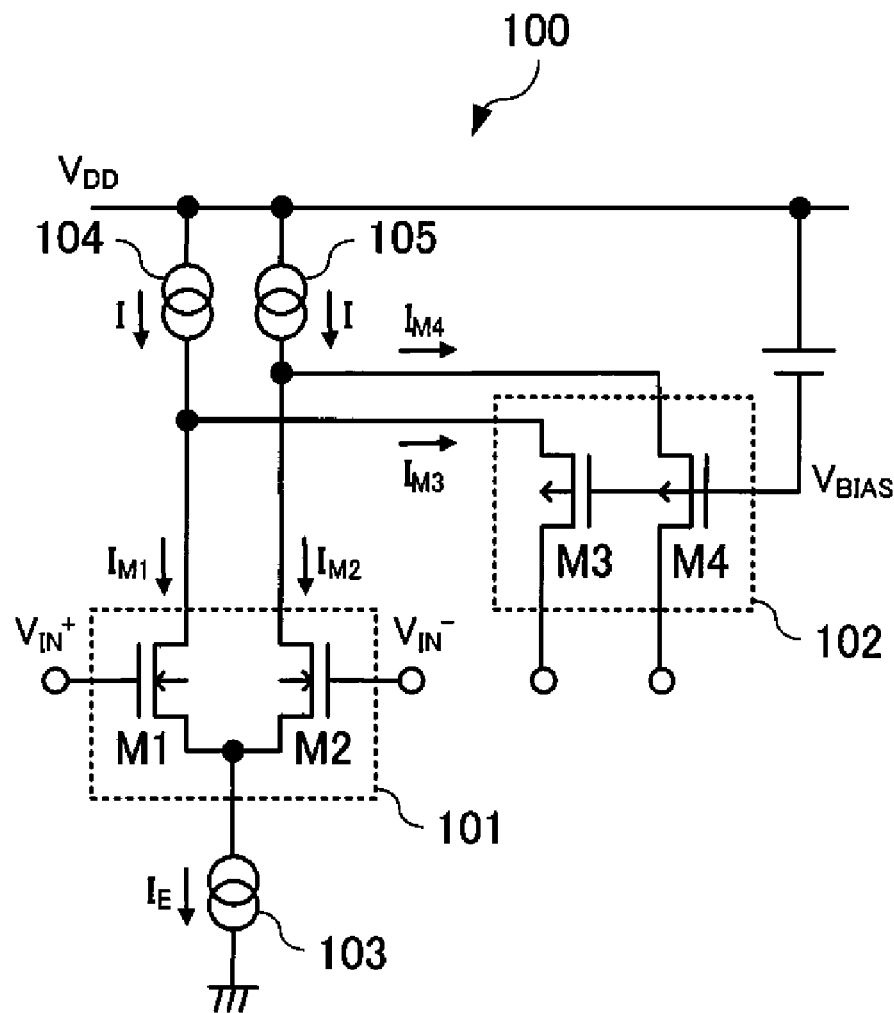
FIG. 6 is a diagram showing a configuration example of a general folded-cascode differential amplifier circuit.
Figure 7:
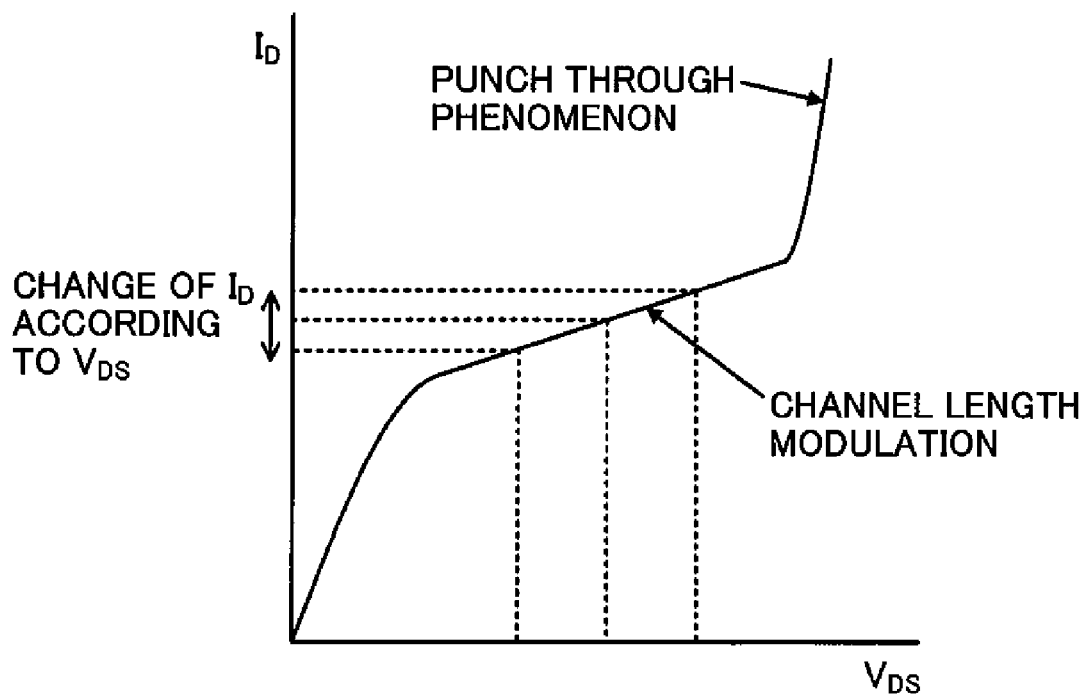
FIG. 7 is a graph showing one example of a relationship between a drain-to-source voltage and a drain current.

FIG. 5 is a diagram showing another example of a configuration of an operational amplifier in which the level shift circuit is embodied. In an operational amplifier 30b, the level shift circuit 31 of the operational amplifier 30 is realized by a constant current source 32 and a P-channel MOSFET (M9: fifth transistor).

In the constant current source 32, one end is applied with the power supply voltage $V_{DD}$ and the other end is connected to a source of the P-channel MOSFET (M9). In the P-channel MOSFET (M9), a drain is grounded and a gate is connected to the sources of the N-channel MOSFETs (M1, M2). The gates of the P-channel MOSFETs (M3, M4), which are the cascode transistors, are connected to the source (electrode, on one side, for generating a threshold voltage in conjunction with a control electrode) of the P-channel MOSFET (M9). Therefore, the result is that the gates of the P-channel MOSFETs (M3, M4) are applied with voltage higher than the source voltage $V_S$ of the N-channel MOSFETs (M1, M2) by a gate-to-source voltage (predetermined level) of the P-channel MOSFET (M9). That is, in the operational amplifier 30b, it is possible to render the drain-to-source voltages $V_{DS}$ of the N-channel MOSFETs (M1, M2) higher as compared to a case of the operational amplifier 20. When the drain-to-source voltages $V_{DS}$ are raised corresponding to a characteristic of the drain-to-source voltages $V_{DS}$ and the drain currents ID in the N-channel MOSFETs (M1, M2), the N-channel MOSFETs (M1, M2) can be stably operated. This enables a stable differential amplification irrespective of the input voltage level.

Thus, a description is given of the differential amplifier circuit of the embodiment. As described above, when the voltage corresponding to the source voltage $V_S$ of the differential transistors 11 is applied to the gates of the cascode transistors 12, the drain-to-source voltages $V_{DS}$ of the differential transistors 11 can be constant irrespective of the input voltage (common mode voltage). Therefore, in the differential amplifier circuit 10 (10a), a stable differential amplification is enabled irrespective of the input voltage (common mode voltage) level.

For example, as shown in the differential amplifier circuit 10, when the gates of the cascode transistors 12 are connected to the sources of the differential transistors 11, it becomes possible to change the drain voltages $V_D$ of the differential transistors 11 along with the source voltage $V_S$, thereby rendering the drain-to-source voltages $V_{DS}$ constant.

As shown in the differential amplifier circuit 10a, when the level shift circuit 31 is provided, the drain-to-source voltages $V_{DS}$ of the differential transistors 11 can be changed to the desired voltage level which matches the characteristic of the differential transistors 11. This enables a stable differential amplification in the differential amplifier circuit 10a.

The level shift circuit 31 can be realized by using the P-channel MOSFET (M8) as shown in the operational amplifier 30a of FIG. 4, for example. This lowers the drain-to-source voltages $V_{DS}$ corresponding to the characteristic of the differential transistors 11. As a result, a stable differential amplification is enabled in the differential amplifier circuit 10a.

The level shift circuit 31 can be realized by using the P-channel MOSFET (M9) as shown in the operational amplifier 30b of FIG. 5, for example. This raises the drain-to-source voltages $V_{DS}$ corresponding to the characteristic of the differential transistors 11. As a result, a stable differential amplification is enabled in the differential amplifier circuit 10a.

The above embodiments of the present invention are simply for facilitating the understanding of the present invention and are not in any way to be construed as limiting the present invention. The present invention may variously be changed or altered without departing from its spirit and encompass equivalents thereof. For example, the level shift circuit 31 is not limited to those in the examples shown in FIG. 4 and FIG. 5. For example, when a well known level shift circuit which uses a resistance to increase or decrease voltage, for example, it becomes possible to set the drain-to-source voltages $V_{DS}$ in the N-channel MOSFETs (M1, M2) to various levels.

It is claimed:

1. A differential amplifier circuit, comprising:

first to third constant current sources;

a first transistor in which an electrode on one side configured to generate a threshold voltage in conjunction with a control electrode is connected to the first constant current source, an electrode on the other side is connected to the second constant current source, and the control electrode is configured to be applied with a first input voltage;

a second transistor in which an electrode on one side configured to generate a threshold voltage in conjunction with a control electrode is connected to the first constant current source, an electrode on the other side is connected to the third constant current source, and the control electrode is configured to be applied with a second input voltage; and a third transistor in which an electrode on one side configured to generate a threshold voltage in conjunction with a control electrode is connected to the electrode on the other side of the first or second transistor, the third transistor being configured to output to an electrode on the other side thereof a current corresponding to a difference between the first and second input voltages, the control electrode of the third transistor being configured to be applied with a voltage corresponding to that of the electrodes on the one side of the first and second transistors.

2. The differential amplifier circuit according to claim 1, wherein the control electrode of the third transistor is connected to the electrodes on the one side of the first and second transistors.

3. The differential amplifier circuit according to claim 1, further comprising a level shift circuit configured to generate a voltage obtained by changing by a predetermined level the voltage of the electrodes on the one side of the first and second transistors, wherein the control electrode of the third transistor is further configured to be applied with the voltage generated by the level shift circuit.

4. The differential amplifier circuit according to claim 3, wherein the level shift circuit is configured by a fourth transistor in which an electrode on one side configured to generate a threshold voltage in conjunction with a control electrode is connected to the electrodes on the one side of the first and second transistors, and an electrode on the other side is connected to the control electrode, and the control electrode of the third transistor is connected to the electrode on the other side of the fourth transistor.

5. The differential amplifier circuit according to claim 3, wherein the level shift circuit is configured by a fifth transistor in which a control electrode is connected to the electrodes on the one side of the first and second transistors, and the control electrode of the third transistor is connected to an electrode on one side of the fifth transistor, the electrode on the one side being configured to generate a threshold voltage in conjunction with the control electrode of the fifth transistor.

* * * * *